(12) United States Patent
Budd et al.

(10) Patent No.: US 8,483,253 B2
(45) Date of Patent: *Jul. 9, 2013

(54) 3D OPTOELECTRONIC PACKAGING

(75) Inventors: Russell A. Budd, North Salem, NY (US); Paul Fortier, Quebec (CA); Frank R. Libsch, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/359,100

(22) Filed: Jan. 26, 2012

(65) Prior Publication Data
US 2012/0120978 A1    May 17, 2012

Related U.S. Application Data

(62) Division of application No. 12/544,710, filed on Aug. 20, 2009, now Pat. No. 8,111,730.

(51) Int. Cl.
*H01S 5/00* (2006.01)

(52) U.S. Cl.
USPC ............. 372/50.12; 372/50.124; 372/50.21; 372/50.23; 372/50.1; 372/34; 372/36

(58) Field of Classification Search
USPC ............ 372/50.12, 50.124, 50.21, 50.23, 372/50.1, 34, 36
See application file for complete search history.

(56) References Cited

U.S. PATENT DOCUMENTS

| 8,111,730 B2 * | 2/2012 | Budd et al. ............ 372/50.124 |
| 2005/0058408 A1 * | 3/2005 | Colgan et al. ............... 385/89 |
| 2006/0081852 A1 * | 4/2006 | Hotta .......................... 257/72 |
| 2007/0085215 A1 * | 4/2007 | Budd et al. ................ 257/778 |
| 2009/0042336 A1 | 2/2009 | Paik et al. |

OTHER PUBLICATIONS

Office Action dated Aug. 21, 2012 issued in related U.S. Appl. No. 13/358,963.

* cited by examiner

*Primary Examiner* — Kinam Park

(74) *Attorney, Agent, or Firm* — Scully, Scott, Murphy & Presser, P.C.; Daniel P. Morris, Esq.

(57) ABSTRACT

An optoelectronic (OE) package or system and method for fabrication is disclosed which includes a silicon layer with a wiring layer. The silicon layer has an optical via for allowing light to pass therethrough. An optical coupling layer is bonded to the silicon layer, and the optical coupling layer includes a plurality of microlenses for focusing and or collimating the light through the optical via. One or more first OE elements are coupled to the silicon layer and electrically communicating with the wiring. At least one of the first OE elements positioned in optical alignment with the optical via for receiving the light. A second OE element embedded within the wiring layer. A carrier may be interposed between electrical interconnect elements and positioned between the wiring layer and a circuit board.

14 Claims, 12 Drawing Sheets

3D OPTOELECTRONIC PACKAGING

CROSS REFERENCE TO RELATED APPLICATION

The present patent application is a divisional application of U.S. patent application Ser. No. 12/544,710, filed Aug. 20, 2009. Further, the present patent application is related to the following commonly-owned, U.S. patent application filed on even date herewith, the entire contents and disclosure of which is expressly incorporated by reference herein in its entirety: U.S. patent application Ser. No. 13/358,963, for "3D OPTOELECTRONIC PACKAGING". Additionally, the present patent application is related to the following commonly-owned, United States patent application filed on Aug. 20, 2009, the entire contents and disclosure of which is expressly incorporated by reference herein in its entirety: U.S. patent application Ser. No. 12/544,696, for "SILICON CARRIER OPTOELECTRONIC PACKAGING".

BACKGROUND

The present invention relates generally to the field of integrated circuits and silicon chip technology, and more particularly, relates to a packaging system or packaging assembly and method thereof for optoelectronic devices in integrated circuits and silicon chip technology.

Computer system performance is increasingly important in current computer systems and data centers, including for example, personal computers, servers and server farms. Computer performance is measured by, for example, system availability, speed of computation, processor speed, among other measurable aspects. The communication bandwidth between computers and within a computer is important in a computer system's overall performance. The current trend towards multi-core processors and multiple processors per machine requires an increase in communication between processors, and between a processor and its memory. Current use of electrical data links perform best over short distances, but they reach a performance limit as the link distance and frequency increases. Optical data links over fiber are capable of high speed communication with low loss over large distances, however, current optical transceivers are bulky and expensive compared with their electrical counterparts.

Therefore, there is a need for a system or assembly/package and a method for reducing the size of optical transceivers used in computers, integrated circuits and chips. It would also be desirable for a system or assembly/package and method to lower the cost of using optical transceivers in computers, integrated circuits and chips.

BRIEF SUMMARY

In an aspect of the invention, an optoelectronic (OE) assembly for a semiconductor or computer chip includes a silicon layer including a wiring layer. The silicon layer defines at least one optical via for allowing light to pass therethrough. An optical coupling layer is bonded to the silicon layer, and the optical coupling layer includes a plurality of microlenses for focusing and or collimating the light through the optical via. At least one first OE element is coupled to the silicon layer and electrically communicating with the wiring layer. The first OE element is positioned in optical alignment with the optical via for receiving the light, and a second OE element embedded within the wiring layer. In a related aspect, the first OE element is attached beneath the silicon layer and electrically communicating with the wiring, and the first OE element is positioned in optical alignment with the optical via for receiving the light. In another related aspect, the assembly further comprises VCSELs (vertical cavity surface emitting lasers) and/or photodiodes as the first OE element. The assembly may further include a plurality of interconnect elements electrically communicating with the wiring layer for attaching the assembly to an additional element providing an additional level of packaging. In a related aspect, the first OE element includes a vertical cavity surface emitting lasers (VCSEL) and/or a photodiode (PD) array. The VCSEL and/or PD array may includes circuitry connected to the wiring layer, the VCSEL and/or PD array being positioned between the wiring layer and a carrier. The assembly may further include a heat spreader between the first OE element and the carrier. In a related aspect, the second OE element includes a laser diode driver (LDD) and/or a transimpedance amplifier (TIA) including a chip having LDD/TIA circuitry. The LDD/TIA circuitry may include a circuitry pitch that is a multiple of an OE pad pitch. The assembly may further include a carrier positioned between the wiring layer of the silicon layer and a circuit board. The carrier may be electrically connecting first interconnect elements connected to the wiring layer of the silicon layer and second interconnect elements connected to the circuit board. Additionally, the assembly may include a carrier for interposing between a plurality of electrical interconnect elements including C4s and compressions bond pads. The carrier may include one or more recessed portions for housing at least one of the first OE elements. The carrier may be positioned between the wiring layer of the silicon layer and a circuit board and electrically connecting first interconnect elements connected to the wiring layer and second interconnect elements connected to the circuit board. The assembly may further include a spacer electrically connecting one or more first OE elements to a PCB. A thermal heat spreader may be positioned above one or more first OE elements and in thermal contact with the first OE elements. The assembly may also include a carrier interposer positioned over the OE elements and in thermal contact with the OE elements providing a thermal sink, and the carrier including an alignment feature for positioning the carrier in mating relation with the optical coupling layer. In a related aspect, at least one semiconductor element may be attached to the wiring layer of the silicon layer. In another related aspect, the semiconductor element is selected from a group comprising: a processor, and an application specific integrated circuit (ASIC) chip. The assembly may further include at least one additional silicon layer including active devices connected to the wiring layer of the silicon layer and connected to a carrier, and the carrier electrically connected to the wiring layer and a circuit board using through vias. In a related aspect, the assembly includes a plurality of silicon spacer layers forming a frame around a bottom of the silicon layer defining a central region on the bottom of the silicon layer. In a related aspect, the silicon spacer layers thermally communicate with at least one of the first and/or second OE devices as a thermal sink.

In another aspect of the invention, an optoelectronic (OE) package or system for semiconductor fabrication includes a silicon layer with a wiring layer. The silicon layer defines at least one optical via for allowing light to pass therethrough. An optical coupling layer is bonded to the silicon layer, and the optical coupling layer including a plurality of microlenses for focusing and or collimating the light through the optical via. At least one first OE element coupled to the silicon layer and electrically communicating with the wiring layer. The first OE element positioned in optical alignment with the optical via for receiving the light. A second OE element is embedded within the wiring layer. A carrier interposes between electrical interconnect elements. The carrier is positioned between the wiring layer of the silicon layer and a circuit board and the carrier electrically connecting first interconnect elements connected to the wiring layer and second interconnect elements connected to the circuit board. In a related aspect, at least one of the second OE elements is a laser diode driver and transimpedance amplifier (LDD/TIA) element, the LDD/TIA element includes a chip having circuitry. In another related aspect, the package further includes a thermal sink interposer positioned over the first OE element and in thermal contact with the first OE element, and the carrier including an alignment feature for positioning the carrier in mating relation with the optical coupling layer. The package may also include at least one additional silicon layer including active devices connected to the wiring layer of the silicon layer and the carrier.

In an aspect of the invention, a method for assembling or packaging a semiconductor or chip includes: fabricating a silicon layer with a wiring layer, the silicon layer defining at least one optical via for allowing light to pass therethrough; bonding an optical coupling layer to the silicon layer, the optical coupling layer including a plurality of microlenses for focusing and or collimating the light through the optical via; coupling at least one first OE element to the silicon layer and the first OE element electrically communicating with the wiring layer; positioning the first OE element in optical alignment with the optical via for receiving the light; a second OE element embedded within the wiring layer; and interposing a carrier between electrical interconnect elements and positioning the carrier between the wiring layer of the silicon layer and a circuit board, and electrically connecting first interconnect elements to the wiring of the silicon layer and second interconnect elements to the circuit board.

In a related aspect, the method includes positioning a thermal sink interposer over the first OE element and in thermal contact with the first OE element. In another relate aspect, the method includes connecting at least one additional silicon layer including active devices connected to the wiring layer of the silicon layer and the carrier.

BRIEF DESCRIPTION OF THE SEVERAL VIEWS OF THE DRAWINGS

These and other objects, features and advantages of the present invention will become apparent from the following detailed description of illustrative embodiments thereof, which is to be read in connection with the accompanying drawings. The various features of the drawings are not to scale as the illustrations are for clarity in facilitating one skilled in the art in understanding the invention in conjunction with the detailed description. In the drawings:

FIG. 2a is a plan view of the integrated OE assembly shown in FIG. 1;

FIG. 2b is a bottom view of the OE assembly shown in FIG. 1 without the LDD/TIA elements;

FIG. 2c is a detail view of the OE assembly shown in FIG. 1, depicting the wiring between the OE active region and their associated contact pads;

DETAILED DESCRIPTION

Figure 1:
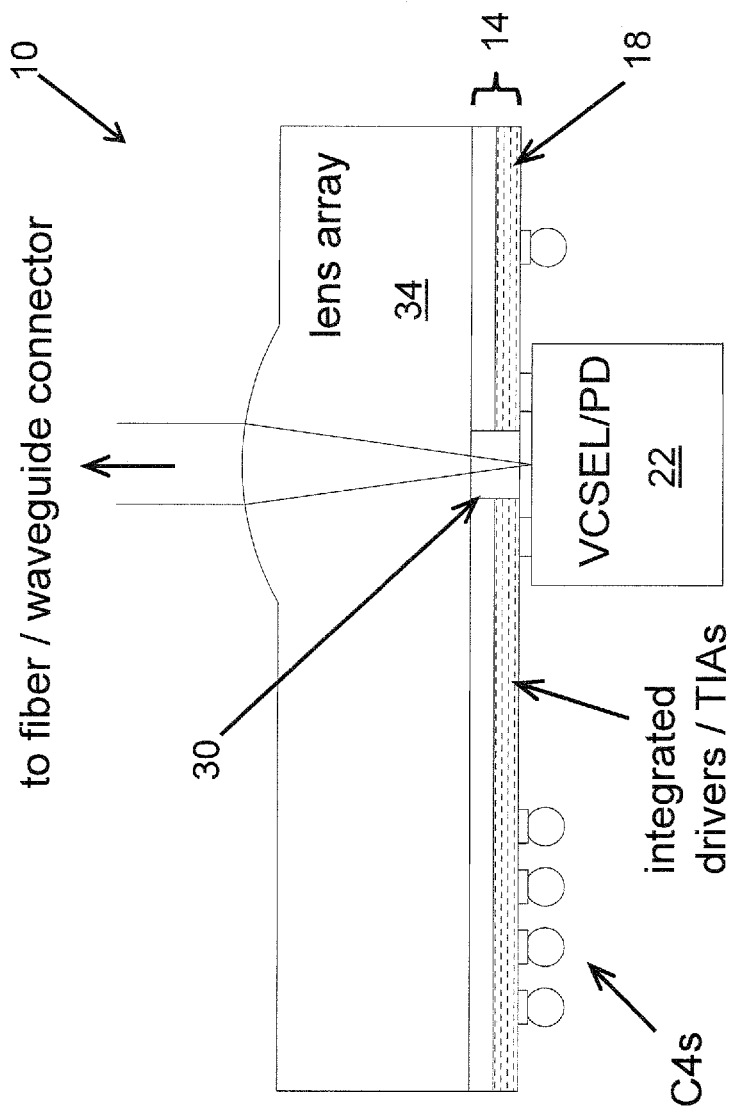
FIG. 1 is a cross sectional side elevational view of an integrated OE assembly according to an embodiment of the invention, including integrated drivers, OE elements, and optical coupling elements.

Referring to FIG. 1, an integrated OE assembly 10 includes a silicon wafer 14 (or thinned silicon) having circuitry/wiring layers 18. The circuitry/wiring layers 18 drive an OE element embodied as a laser diode array (e.g., vertical cavity surface emitting lasers (VCSEL)) and/or amplifies the signals from a photodiode (PD) array, collectively referred to as a VCSEL/PD or OE array 22. The OE arrays 22 communicate with laser diode drivers (LDD) and transimpedance amplifiers (TIAs) collectively referred to as LDD/TIA circuitry 50, shown in FIG. 2b. In the embodiment of the invention show in FIG. 1, LDD drivers and/or TIAs are integrated in the wiring circuitry, using LDD/TIA circuitry 54, shown in FIG. 2b.

It is understood that an OE element may be comprised of either active or passive components, and may serve an optical function (send, receive, direct or pass light) and an electrical function (process, amplify signals, wiring, or electrical pads, or contacts).

In one embodiment of the invention, the silicon wafer 14 may be fabricated using standard CMOS (complementary metal oxide semiconductor) processes. During fabrication of the OE assembly 10, after the circuitry/wiring layers 18 are complete, an optical through hole 30 via is fabricated there through. The OE element through hole 30 enables light to pass from the OE array (VCSEL/PD) 22 to a microlens array 34 positioned over the silicon wafer 14. The through hole 30, in one embodiment of the invention, may be about 10 to 200 microns in diameter and may be realized using an etch process such as a Bosch™® etch, or other etch process. The through hole may be larger, and in an alternative embodiment, a slot hole may be used to accommodate many optical ports.

The microlens array 34 collimate or focuses the light to and from the OE array 22. The silicon wafer 14 is bumped by attaching C4 balls 46, or other interconnect elements, for example, pins, or columns. The VSCEL array (laser diode array) and/or a photodiode array 22 is bonded to, and positioned below the silicon wafer 14.

During fabrication, in another embodiment of the invention, a silicon wafer is attached to a temporary handling wafer (not shown), and is ground and polished to a thickness of about between 5 to 50 microns. After polishing, the silicon wafer may be further thinned by chemical etching (using TMAH, KOH, or other means) to just leave silicon wiring and silicon circuitry on the glass handler. By removing the bulk silicon and leaving just the silicon wiring the assembly's high speed electrical performance is improved. Also, by leaving just the silicon wiring and circuitry on the glass handler there is no need to fabricate an optical via or optical window since the bulk silicon is removed.

The silicon wafer 14 is then transferred and attached to a glass wafer which contains microlenses 34 as shown in FIG. 1. The glass microlens array wafer may have a thickness of about 200 to 800 microns. The temporary handling wafer is then removed exposing the silicon circuitry 18 and pads 42. The silicon wafer 14 is then bumped by attaching C4 balls 46, or other interconnect elements, for example, pins, or columns. The next step in the fabrication of the OE assembly 10, is to attach the OE array 22. The VSCEL array (laser diode array) and/or a photodiode array 22 is bonded to the silicon wafer 14 using standard flip chip bonding tools (such as SUSS® Microtech flip chip bonder Model 150 or Model 250). The OE array 22 to silicon wafer 14 join may consist of, for example, C4s or micro C4s, compression bonds, or other interconnects. Thereby, the resulting OE assembly 10, as shown in FIG. 1, is fabricated. Other embodiments of the fabrication of the OE assembly 10 may include the glass wafer having microlenses of spherical or aspherical shapes. The microlenses can be refractive or diffractive, or a combination of both. Alternatively, instead of glass other optically transparent materials could be used such as InP (indium phosphorus) or GaAs (gallium arsenide) or suitable optical plastic. In one embodiment of the invention, the silicon wafer may be fabricated using standard CMOS processes. Alternatively other device substrates could be used such as substrates made of, for example, SiGe, GaAs, SOI (silicon on insulator). The bonding of the glass lens wafer to the silicon wafer is performed using standard wafer to wafer bonding tools, for example, with an alignment accuracy of about +/−1 micron.

Figure 2C:
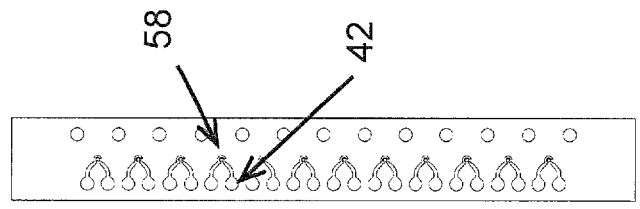
FIGS. 2a, 2b, and 2c, show a top, bottom and plan view of an integrated OE assembly; also shown are the integrated laser diode drivers and/or transimpedence amplifers (LDD/TIA) circuitry and wiring.
Figure 2B:
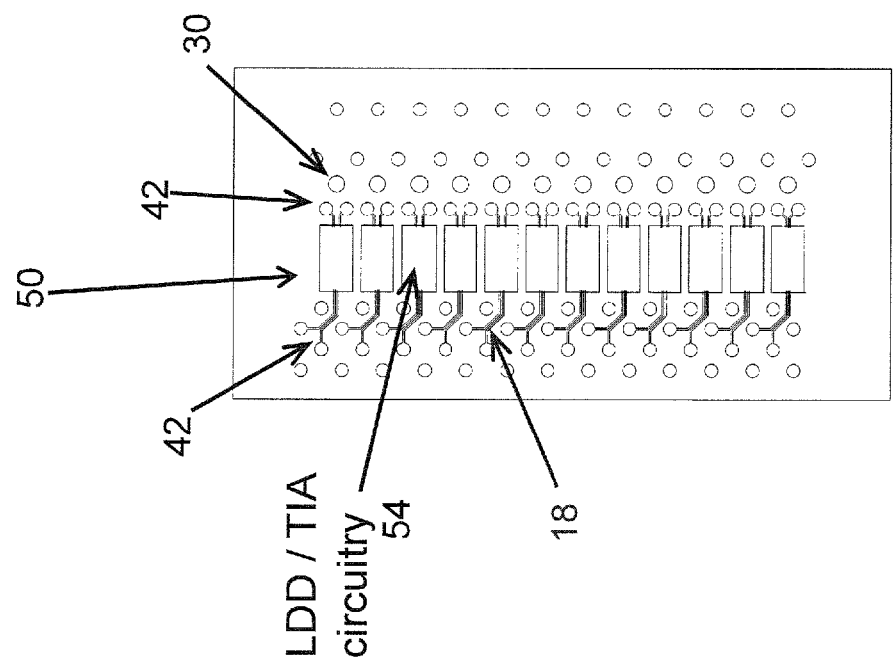
Figure 2A:
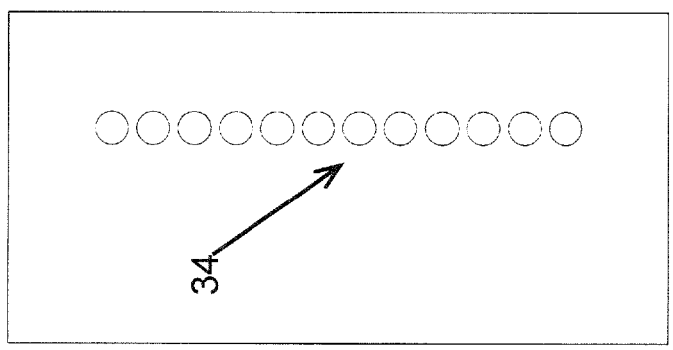

Referring to FIG. 2a, the lens array 34 of the OE assembly 10 is shown in a 1×12 array of microlenses. It is understood that other lens arrangements are possible, such as a 1×4 array or a two dimensional array of lenses. Referring to FIG. 2b, the OE assembly 10 is shown with the OE array 22 removed. The interconnect pads 42 (which may be bumped with C4 solder balls) connect the OE assembly 10 and a next level of packaging. High density wiring 18 connects the pads 42 to the laser diode drivers (LDD) and/or trans-impedance amplifiers (TIA) (LDD/TIA) circuitry 54. The LDD/TIA circuitry 54 is connected to the pads 42 to which the OE devices 22 are mounted. The through hole optical via 30 allows light 32 to pass between the microlenses 34 and the OE array 22. When using high frequency electrical signals, controlling the electrical impedance, controlling near neighbor electrical signal crosstalk, and balance the timing skew between different channels between the input (interconnect) pads of the LDD/TIA circuitry 54 and the output (OE) pads 42 is considered to manage signal integrity. One way to manage and maintain signal integrity is by minimizing the electrical signal lines length difference between the channels in the layout of the LDD/TIA circuitry 54 layout. Another optimization of the circuitry 54 layout includes minimizing the area of the LDD/TIA circuitry 54 layout which may include placing the individual LDD/TIA channel circuitry 54 on the same pitch as the OE pads 42 or OE diodes. In another embodiment of the invention, the OE assembly 10 has LDD/TIA circuitry including a circuitry pitch that is a multiple of an OE pad pitch.

Referring to FIG. 2c, the VCSEL array 22 contains a source region 58. The pads 42 interconnect the source region 58 to silicon drive circuitry. The arrangement of pads is similar for photodiode (PD) arrays. It is understood that the OE array 22 may be multidimensional, for example a 2×12, 4×12 or a larger array of active elements.

Figure 3:
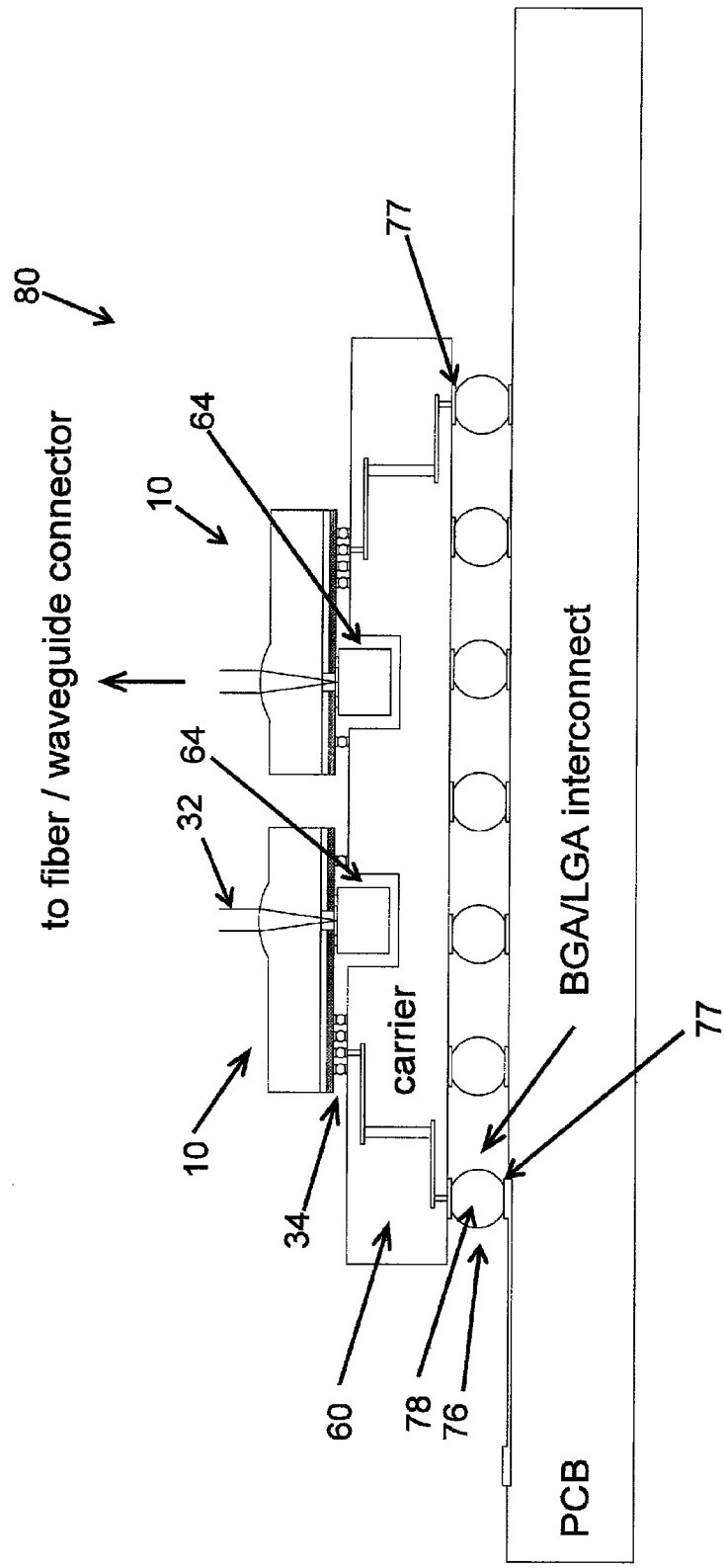
FIG. 3 is a cross sectional side elevational view of an embodiment of an OE package including the OE assembly shown in FIG. 1, the OE package includes a chip carrier attached to a printed circuit board using a BGA or LGA interconnect.

Referring to FIG. 3, two of the OE assemblies 10 shown in FIG. 1 are mounted on a carrier 60. The carrier 60 may be, for example, an organic laminate. The OE arrays 22 on the OE assemblies 10 protrude into cavities 64 in the carrier 60. C4 solder balls interconnect the OE assemblies 10 to the carrier 60. The carrier 60 is attached to a printed circuit board (PCB) 72 using a ball grid array (BGA) or land grid array (LGA) interconnect 76 having pads 77 and solder balls 78, resulting in an OE package 80. The carrier 60 serves as an electrical and mechanical interposer between the OE assembly 10 and the PCB 72.

Figure 4:
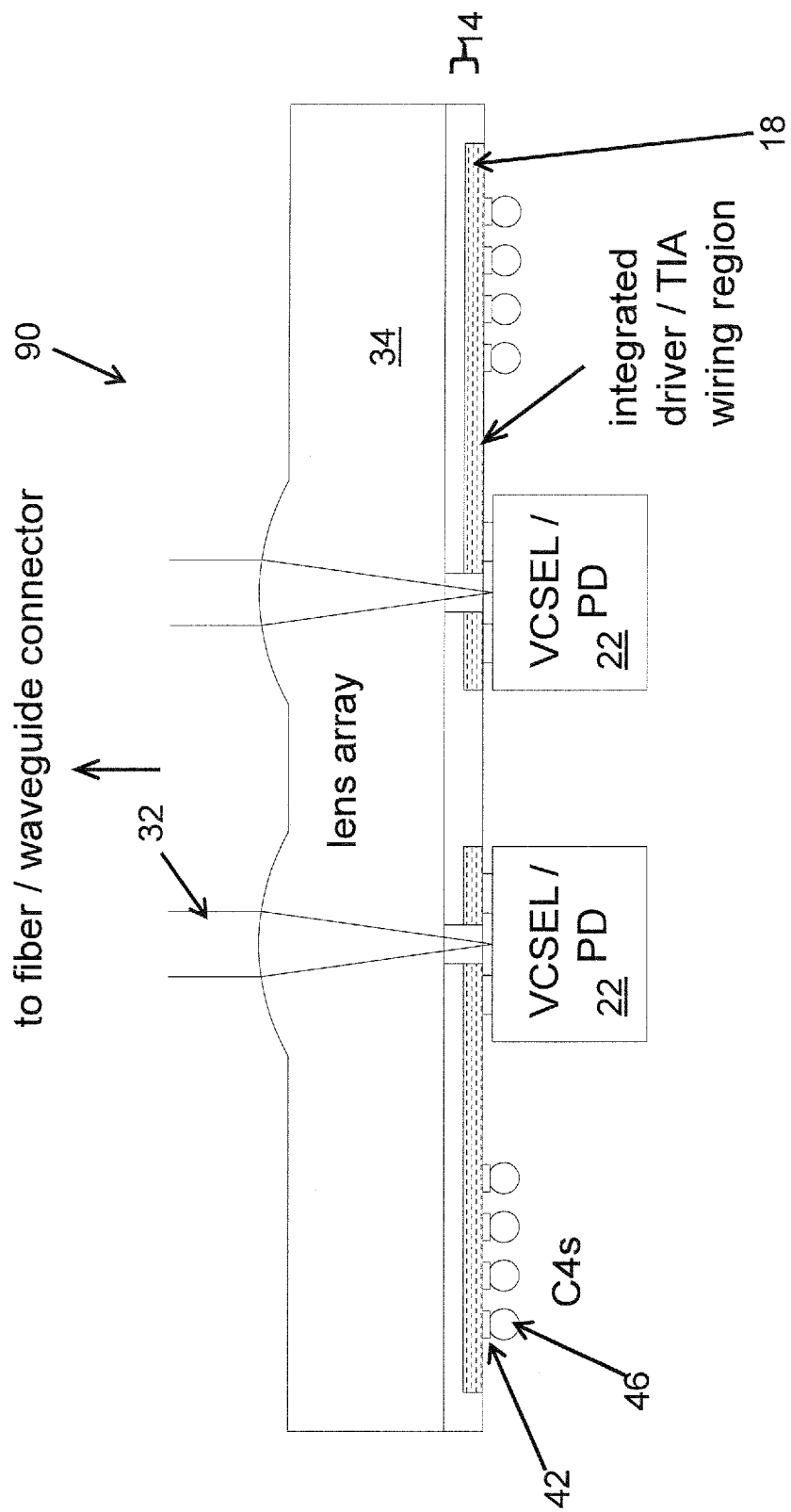
FIG. 4 is a cross sectional side elevational depiction of another embodiment of an integrated OE assembly with two (or more) OE elements, driver/TIA circuitry, and optical coupling elements.

Referring to FIG. 4, another embodiment of an OE assembly 90 includes two OE arrays 22. Similar elements in the OE assembly 90 to elements in the OE assembly 10 shown in FIG. 1, have the same reference numerals. It is understood that the number of OE arrays may be extended beyond two arrays. It is also understood that the combination VCSEL and photodiode arrays 22 may be used on the OE assembly 90 to function as a transceiver.

Figure 5:
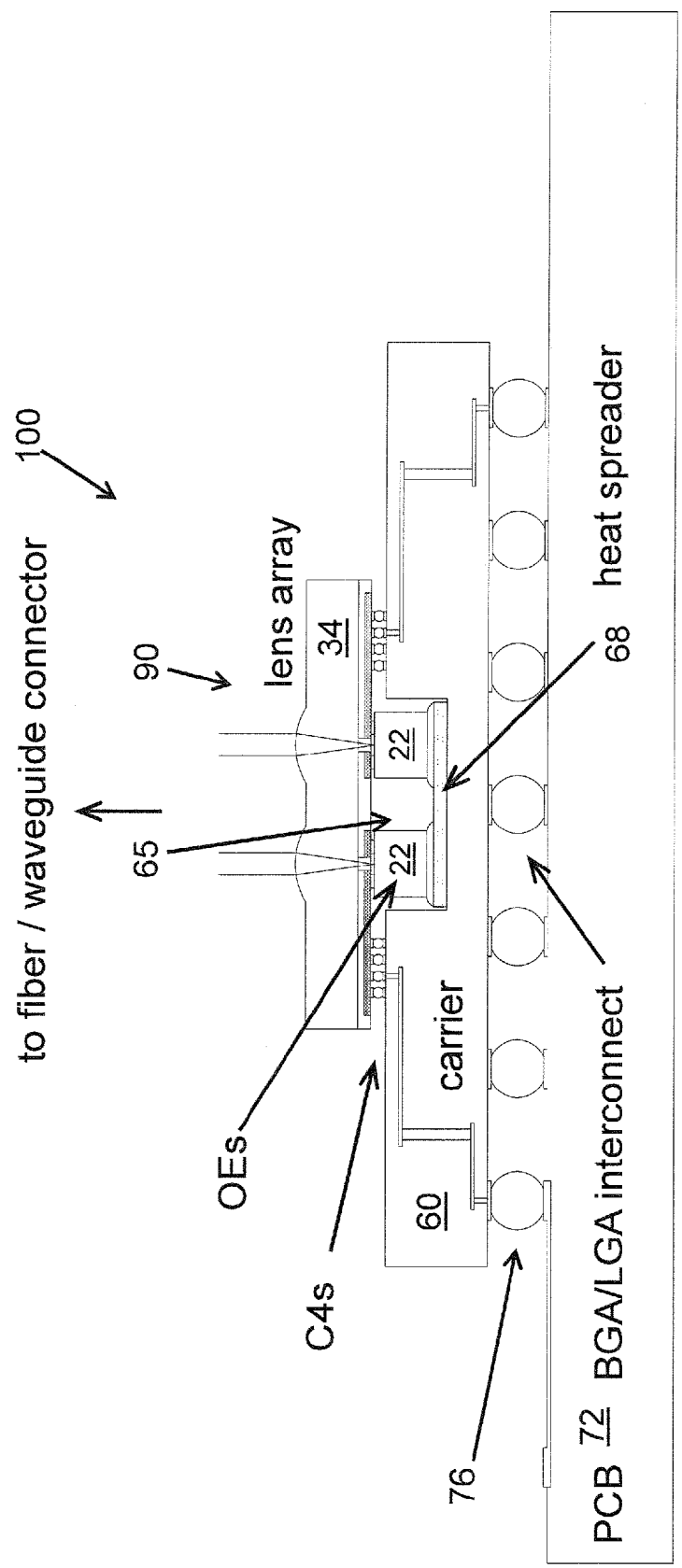
FIG. 5 is a cross sectional side elevational depiction of an OE package including the OE assembly shown in FIG. 4.

Referring to FIG. 5, the OE assembly 90 shown in FIG. 4 is connected to the carrier 60 with the two OE arrays 22 in a recess 65 in the carrier 60. The carrier is connected to PCB 72 using BGA/LGA interconnect 76 to form an OE package 100. The carrier 60 also provides an electrical and mechanical interposer between the OE assembly 90 and the PCB 72. A heat spreader 68 is positioned between the bottom of the recess 65 and the OE arrays 22. The heat spreader 68 may be used to transfer heat from the OE arrays 22 and CMOS devices such as the integrated LDD drivers/TIA 50, 54, to the side of the package 100 for removal, for example, by an air cooled heat sink, a water cooled heat sink, or by other standard heat removal devices.

Figure 6:
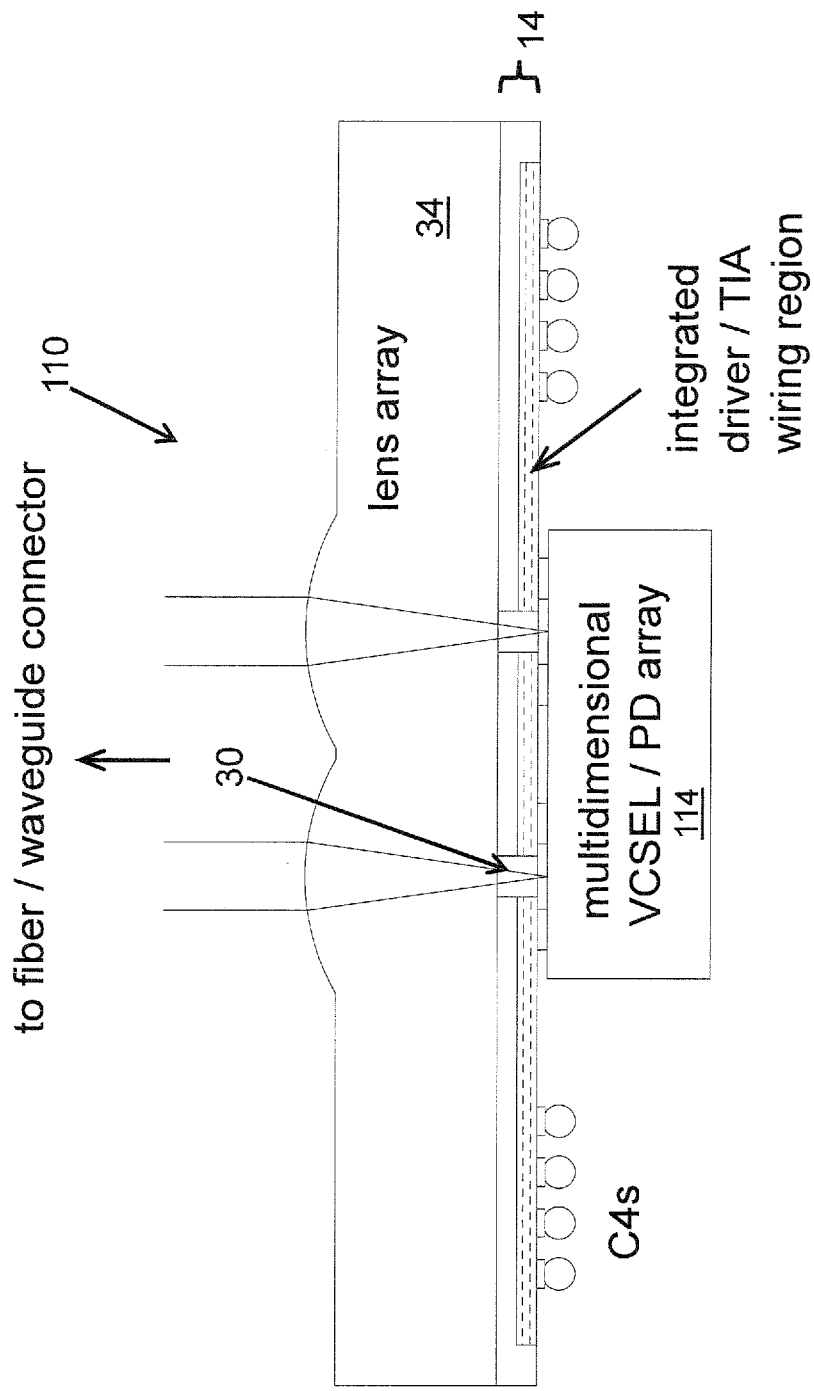
FIG. 6 is a cross sectional side elevational depiction of another embodiment of an integrated OE assembly using a multidimensional OE array.

Referring to FIG. 6, an OE assembly 110 includes a multidimensional OE array (VCSEL/PD array) 114. In the OE assembly 110, like features with respect to the OE assembly 90 shown in FIG. 4 have the same reference numerals. The multidimensional array 114 enables dense packing of OE devices, such as VCSELs and PDs, on a single OE chip, such as the thinned silicon wafer 14 of the OE assembly 110.

Figure 7:
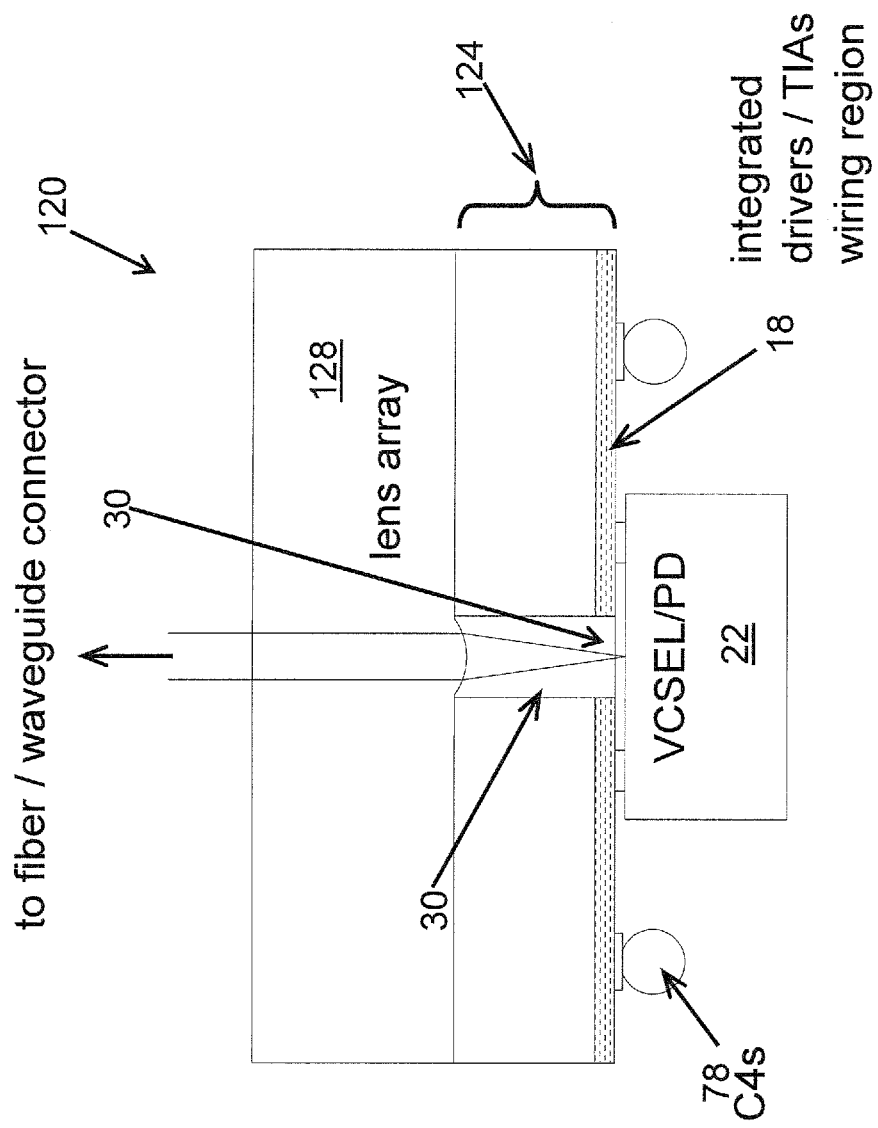
FIG. 7 is a cross sectional side elevational depiction of another embodiment of an optical coupling arrangement attached to a thick silicon wafer/chip with integrated drivers/TIAs and with an attached OE element.

Referring to FIG. 7, another embodiment of an OE arrangement 120 includes a silicon wafer 124 which is thicker than in the previous embodiments. However, like features with respect to the OE assembly 10 shown in FIG. 1 have the same reference numerals. The silicon wafer 124 may be, for example, about 100 to 800 microns thick. An optical coupling glass wafer/lens array 128 is reversed with respect to the previous embodiment of the invention, such that the microlens array 128 faces the OE array 22. The present embodiment is advantageous because less grinding and polishing of the silicon wafer 124 is required.

Figure 8:
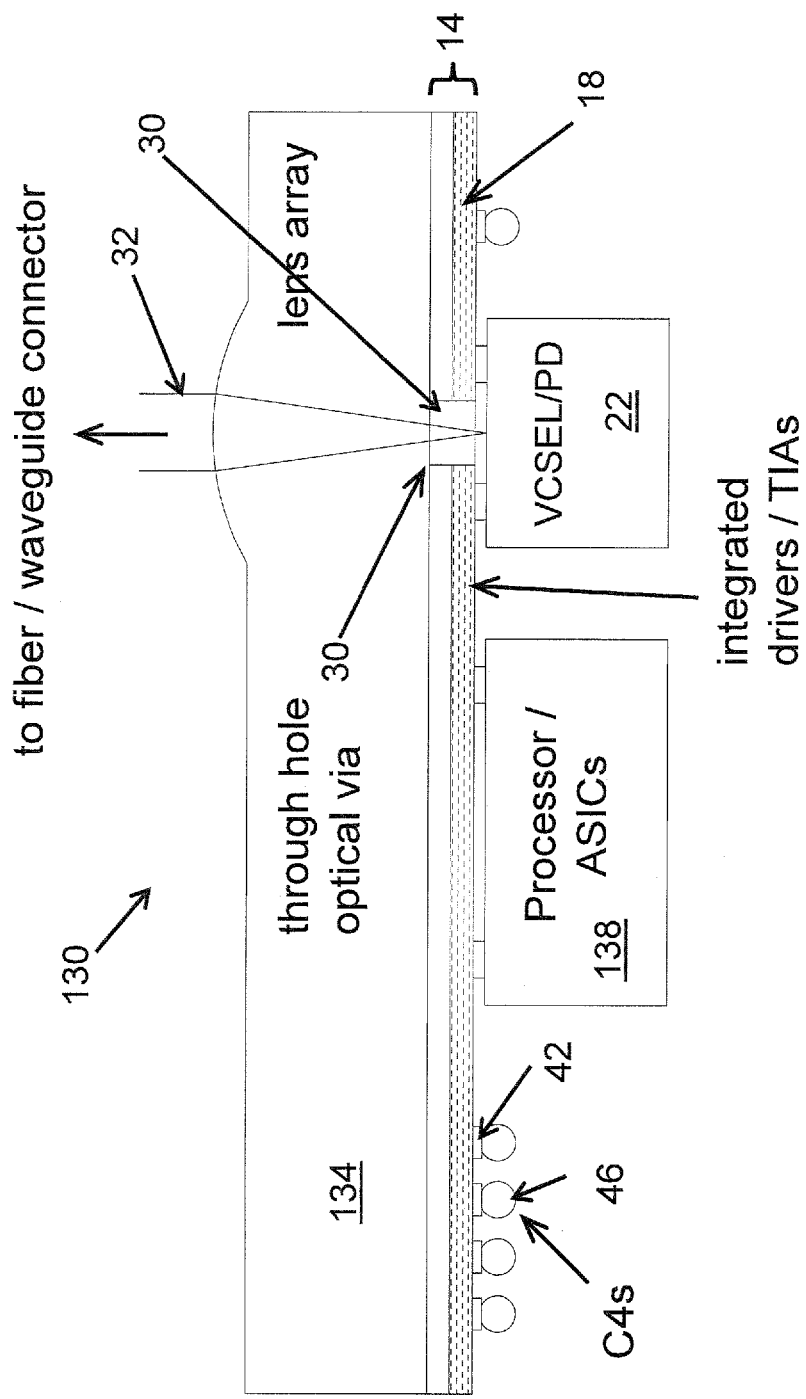
FIG. 8 is a cross sectional side elevational depiction of another embodiment of an integrated OE assembly with an attached processor or ASIC device.

Referring to FIG. 8, an OE assembly 130 includes an additional device attached to the silicon wafer 14, and like features with respect to the OE assembly 10 shown in FIG. 1 have the same reference numerals. The additional device may be a processor or ASIC (application specific integrated circuit) device as shown in FIG. 8. In one embodiment, the additional device 138 is positioned as close as possible to the VCSEl/PD 22 to minimize the electrical power and cost by incorporating some or all of the LDD circuitry 154 within the additional device. In another embodiment, it may be desirable to use standard (non-custom) additional device(s) where the needed LDD/TIA circuitry 154 requirements are in the thinned silicon 14.

Figure 9A:
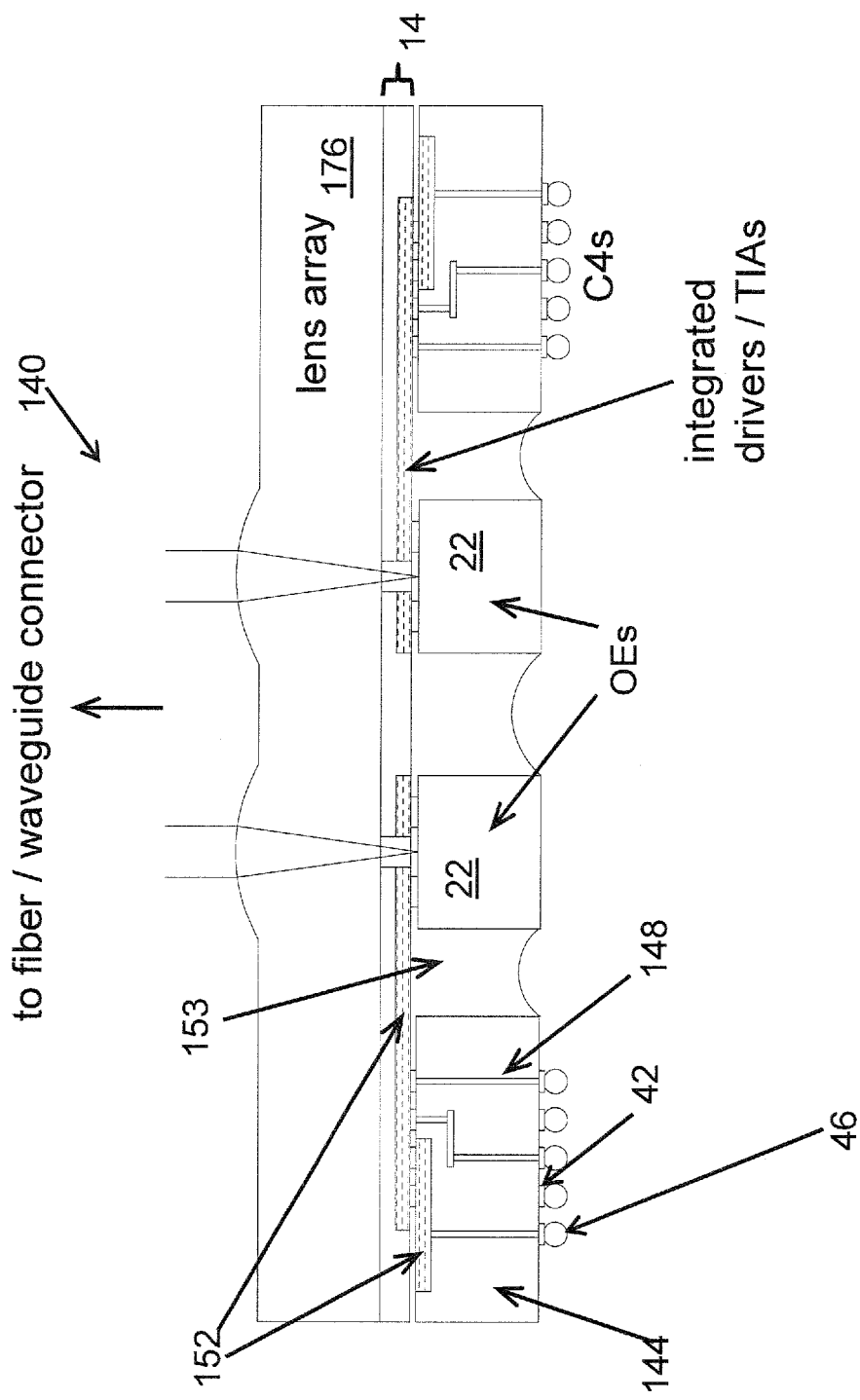
FIG. 9a is a cross sectional side elevational depiction of an integrated OE assembly with a through via spacer attached.
Figure 10:
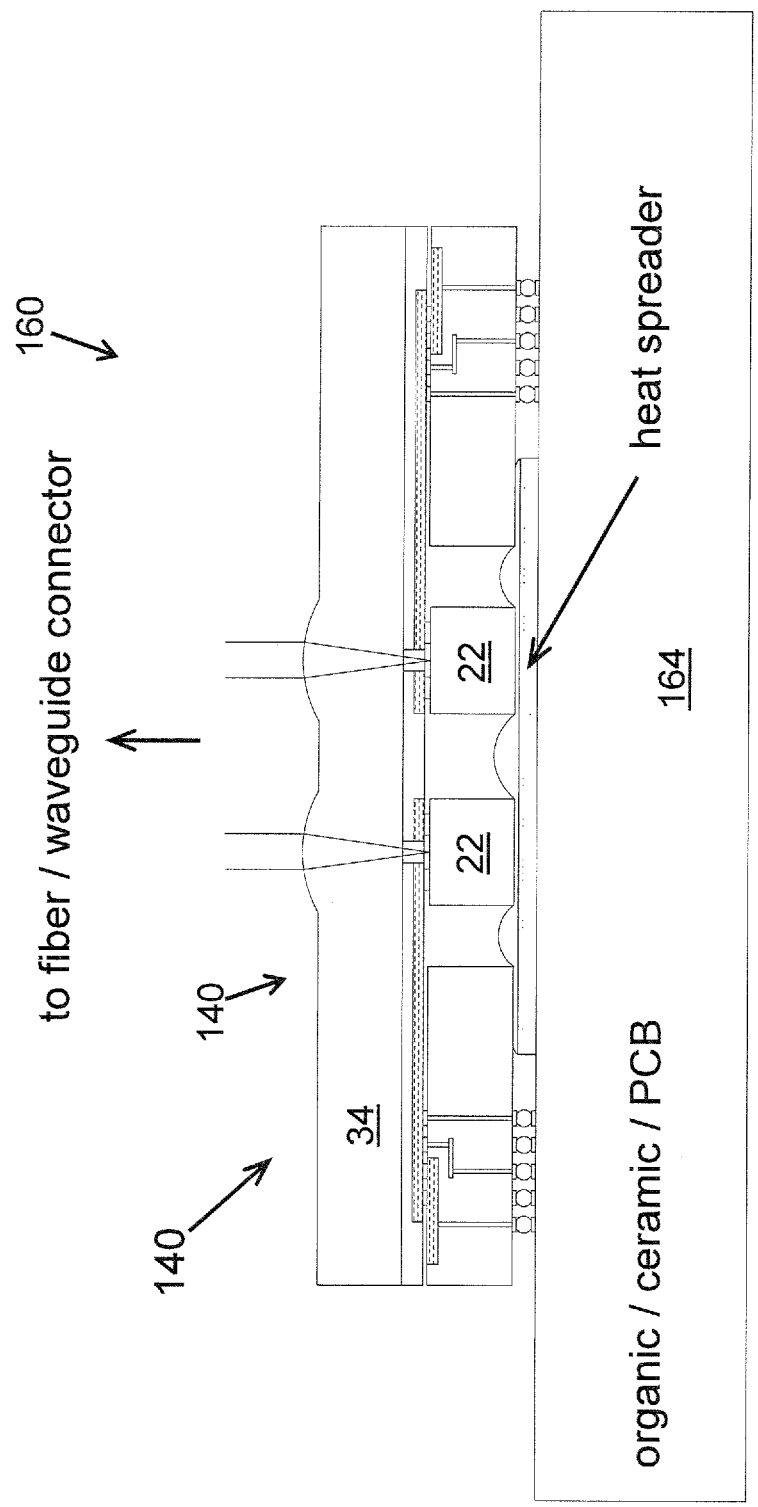
FIG. 10 is a cross sectional side elevational depiction of an OE package including an OE assembly, the OE package includes through via spacers attached to an organic, ceramic, or PCB board.

Referring to FIG. 9a, an OE assembly 140 includes a through via 148 silicon spacer 144. In the OE assembly 140, like features with respect to the OE assembly 90 shown in FIG. 4 have the same reference numerals. The silicon spacer 144 may also incorporate passive and/or active electrical components 152, as well as provide the electrical pad 42 interposing between the OE assembly 140 and the PCB 72 as shown in FIG. 10 resulting in an OE package 160. The OE assembly 140 also includes underfill 153 as shown in FIG. 9a. Referring to FIG. 10, a heat spreader 164 is used to transfer heat away from the LDD chip/TIA 50, and OE devices 22.

Figure 9C:
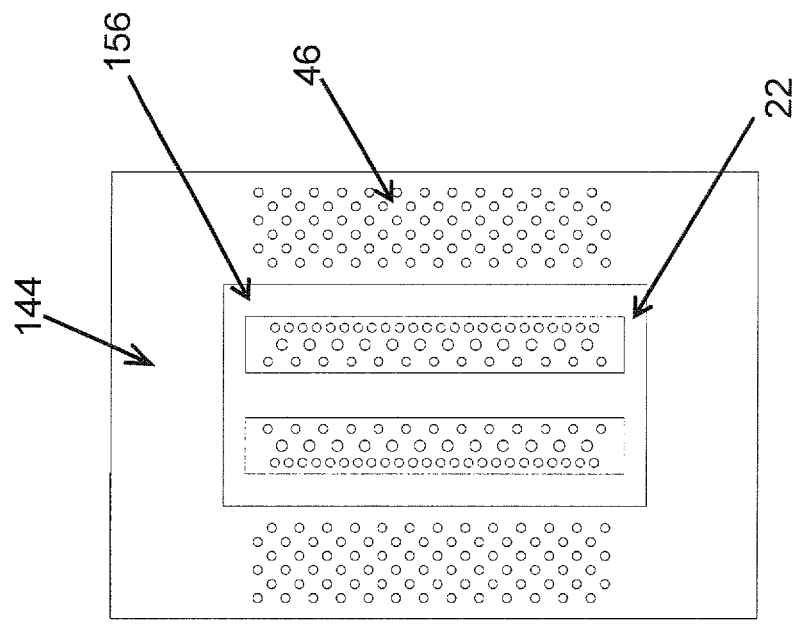
FIGS. 9b and 9c are bottom views of OE assemblies with attached through via spacers.
Figure 9B:
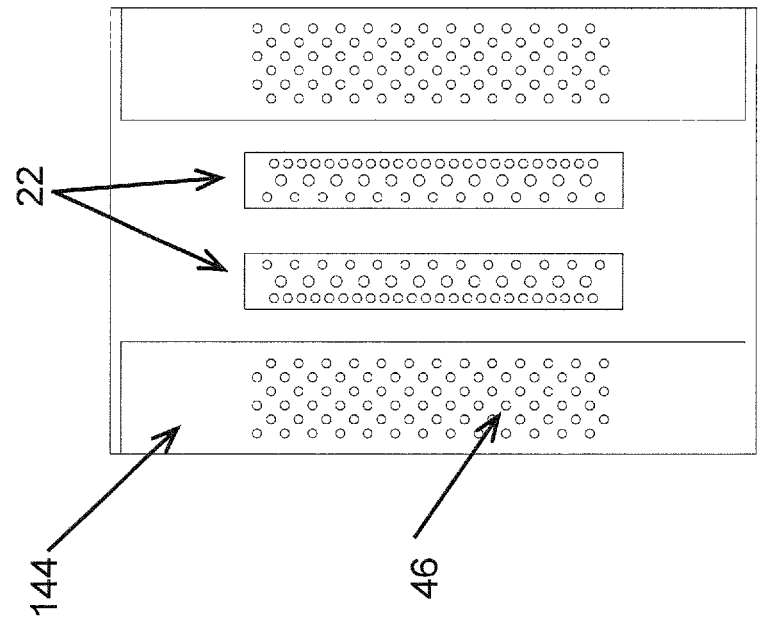

Referring to FIGS. 9b and 9c, the silicon spacers 144 may be positioned individually around the periphery of the silicon wafer 14 with the OE arrays 22 centrally positioned, as shown in FIG. 9b. Alternatively, the silicon spacer 144 may be a single part with a center opening 156 receiving the OE arrays 22.

Referring to FIG. 10, the OE assembly shown in FIG. 9 may be mounted on a further organic, or ceramic, or other suitable substrate. A heat spreader (made of a high thermal conductive material) may be positioned below the OE assembly to aid the removal of heat from the OE devices and drive circuitry.

Figure 11:
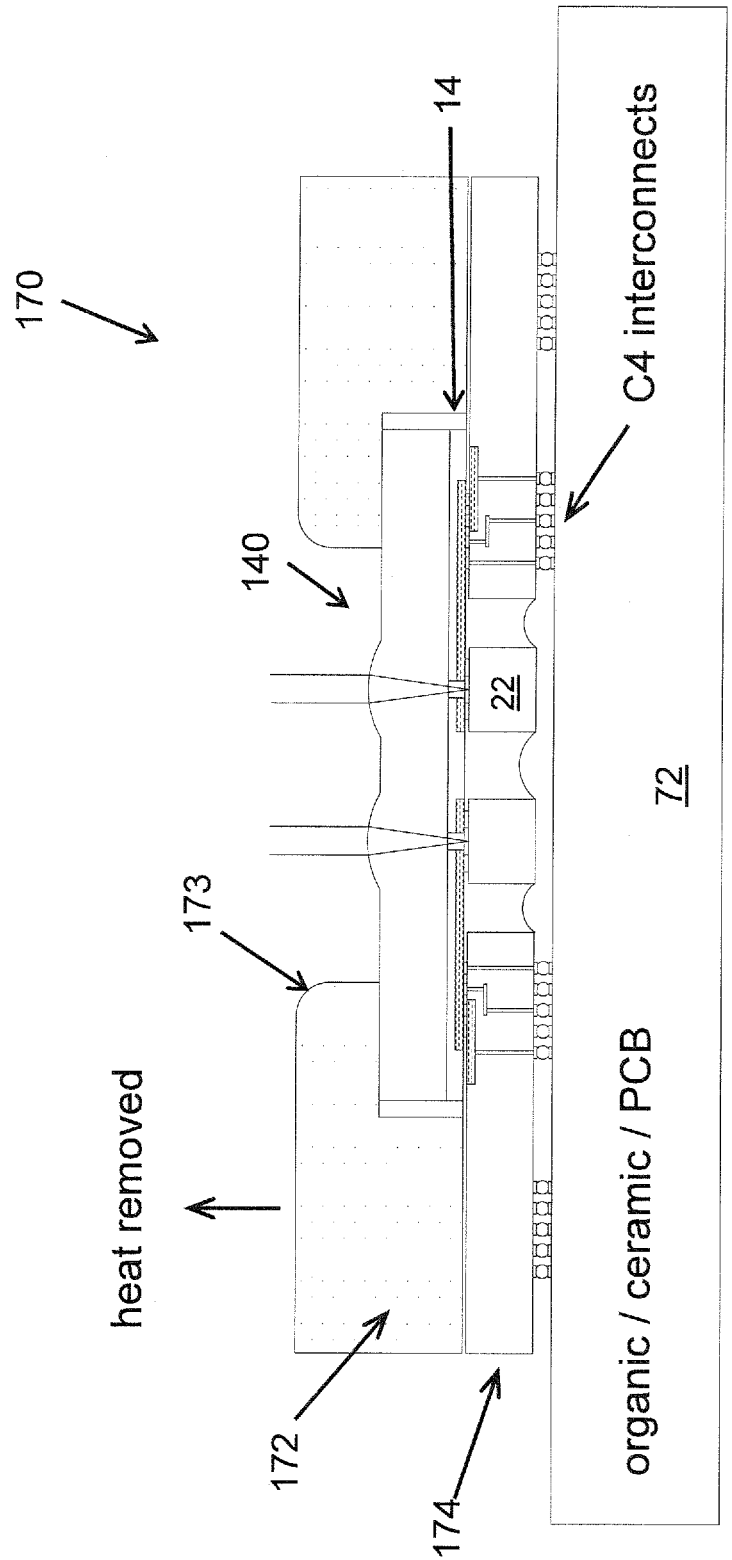
FIG. 11 is a cross sectional side elevational depiction of an OE package including an OE assembly, the OE package includes through via spacers and a top side heat spreader.

Referring to FIG. 11, the OE assembly 140 is part of an OE package 170 including an extended silicon spacer 174 and a top side heat spreader 172. The silicon spacer 174 also serves as a thermal interposer between the thinned silicon 14 and the heat spreader 172. The top side heat spreader 172 may also incorporate a feature, such as a notch or curvature 173, to align an optical connector (not shown). The heat spreader 172 may be passively aligned to the lens array by referencing the lens edge or referencing a lithographically defined notch on the top of the lens array. Instead of incorporation the VCSEL drive circuitry in the thinned silicon layer as shown, separate CMOS driver chips (not shown) may be mounted adjacent to the OE devices.

Thereby, the OE packages and OE assemblies shown in the embodiments of the invention, integrate the OE transceiver elements in a compact space. Thereby, the present invention provides a system and assembly of integrated packaging, and a method of integrated packaging for reducing the size and lowering the cost of optical transceivers. More specifically, the optoelectronic drivers and receivers are processed and packaged with optical coupling elements, and OE (VCSEL and PD) elements using a wafer scale packaging technology, together with 3D stacking, for integrating the elements in a compact space, resulting in improved density of components and lower cost manufacturing or fabrication.

While the present invention has been particularly shown and described with respect to preferred embodiments thereof, it will be understood by those skilled in the art that changes in forms and details may be made without departing from the spirit and scope of the present application. It is therefore intended that the present invention not be limited to the exact forms and details described and illustrated herein, but falls within the scope of the appended claims.

What is claimed is:

1. An optoelectronic (OE) package comprising:
   an integrated OE assembly adapted for mounting on a circuit board via an interposer device, said integrated OE assembly comprising:
      a silicon layer including a wiring layer, the silicon layer defining at least one optical via for allowing light to pass therethrough;
      an optical coupling layer bonded to the silicon layer, the optical coupling layer including a plurality of microlenses for focusing and or collimating the light through the optical via;
      at least one first OE element coupled to the silicon layer and electrically communicating with the wiring layer, the first OE element positioned in optical alignment with the optical via for receiving the light; and
      a laser diode driver (LDD) device embedded within the wiring layer; and said interposer device comprising:
      a carrier positioned between the integrated OE assembly and said circuit board and having conductive wiring for providing electrical communication between first conductive interconnect elements that connect said integrated OE assembly to said carrier and second conductive interconnect elements that connect said carrier to said circuit board,
      the carrier including a respective surface cavity corresponding to an OE element within which the corresponding first OE elements protrudes.

2. The optoelectronic (OE) package of claim 1, wherein the first OE element is attached beneath the silicon layer and electrically communicating with the wiring, and the first OE element being positioned in optical alignment with the optical via for receiving the light.

3. The optoelectronic (OE) package of claim 1, further comprising:
   VCSELs (vertical cavity surface emitting lasers) and/or photodiodes as the first OE element.

4. The optoelectronic (OE) package of claim 1, further comprising:
   a plurality of interconnect elements electrically communicating with the wiring layer for attaching the assembly to an additional element providing an additional level of packaging.

5. The optoelectronic (OE) package of claim 1, wherein the first OE element includes is a vertical cavity surface emitting lasers (VCSEL) and/or a photodiode (PD) array, the VCSEL and/or PD array includes circuitry connected to the wiring layer, the VCSEL and/or PD array being positioned between the wiring layer and a carrier.

6. The optoelectronic (OE) package of claim 1, further comprising: a trans-impedance amplifier (TIA) embedded within the wiring layer in addition to said LDD to form LDD/TIA circuitry.

7. The optoelectronic (OE) package of claim 6, wherein the LDD/TIA circuitry includes a circuitry pitch that is a multiple of an OE pad pitch.

8. An optoelectronic (OE) system for semiconductor fabrication, comprising:
   an integrated OE assembly adapted for mounting on a circuit board via an interposer device, said integrated OE assembly comprising:
      a silicon layer with a wiring layer, the silicon layer defining at least one optical via for allowing light to pass therethrough;

an optical coupling layer bonded to the silicon layer, the optical coupling layer including a plurality of microlenses for focusing and or collimating the light through the optical via;

at least one first OE element coupled to the silicon layer and electrically communicating with the wiring layer, the first OE element positioned in optical alignment with the optical via for receiving the light;

a second OE element embedded within the wiring layer; and said interposer device comprising:

a carrier for interposing between electrical interconnect elements, the carrier positioned between the wiring layer of the silicon layer and a circuit board and the carrier electrically connecting first interconnect elements connected to the wiring layer and second interconnect elements connected to the circuit board, said carrier including a respective surface cavity corresponding to an OE element within which the corresponding first OE element protrudes.

9. A method for assembling or packaging a semiconductor or chip, comprising:

fabricating an optoelectronic (OE) assembly by forming a silicon layer with a wiring layer, the silicon layer defining at least one optical via for allowing light to pass therethrough;

bonding an optical coupling layer to the silicon layer, the optical coupling layer including a plurality of microlenses for focusing and or collimating the light through the optical via;

coupling a first OE element to the silicon layer and the first OE element electrically communicating with the wiring layer;

positioning the first OE element in optical alignment with the optical via for receiving the light;

embedding a second OE element within the wiring layer; and interposing a carrier between said integrated OE assembly and a circuit board, said carrier electrically connecting first conductive interconnect elements to the wiring layer of the silicon layer and electrically connecting second conductive interconnect elements to the circuit board, and forming a respective surface cavity in said carrier corresponding to an OE element within which the corresponding first OE element protrudes.

10. The optoelectronic (OE) system of claim 8, wherein the at least one first OE element is attached beneath the silicon layer and electrically communicating with the wiring, and the first OE element being positioned in optical alignment with the optical via for receiving the light.

11. The optoelectronic (OE) system of claim 8, further comprising:

VCSELs (vertical cavity surface emitting lasers) and/or photodiodes as the first OE element.

12. The optoelectronic (OE) system of claim 8, further comprising:

a plurality of interconnect elements electrically communicating with the wiring layer for attaching the assembly to an additional element providing an additional level of packaging.

13. The optoelectronic (OE) system of claim 8, wherein the first OE element includes is a vertical cavity surface emitting lasers (VCSEL) and/or a photodiode (PD) array, the VCSEL and/or PD array includes circuitry connected to the wiring layer, the VCSEL and/or PD array being positioned between the wiring layer and a carrier.

14. The optoelectronic (OE) system of claim 8, wherein the second OE element includes a laser diode driver (LDD) and/or a trans-impedance amplifier (TIA) including a chip having LDD/TIA circuitry.

* * * * *